United States Patent [19]

Seiler

[11] Patent Number: 4,580,131
[45] Date of Patent: Apr. 1, 1986

[54] BINARILY WEIGHTED D TO A CONVERTER LADDER WITH INHERENTLY REDUCED LADDER SWITCHING NOISE

[75] Inventor: Norman C. Seiler, W. Melbourne, Fla.

[73] Assignee: Harris Corporation, Melbourne, Fla.

[21] Appl. No.: 500,910

[22] Filed: Jun. 3, 1983

[51] Int. Cl.[4] .............................................. H03M 1/00
[52] U.S. Cl. ............................................ 340/347 DA
[58] Field of Search .................................. 340/347 AD

[56] References Cited

U.S. PATENT DOCUMENTS

| | | | |
|---|---|---|---|
| 3,216,001 | 11/1965 | Hinrichs | 340/347 DA |
| 3,588,882 | 6/1971 | Propster | 340/347 DA |
| 3,735,392 | 5/1973 | Kaneko | 340/347 AD |
| 4,318,085 | 3/1982 | Whiteside et al. | 340/347 DA |
| 4,381,499 | 4/1983 | Struthoff | 340/347 DA |
| 4,415,883 | 11/1983 | von Sichart | 340/347 DA |

FOREIGN PATENT DOCUMENTS 0603134  4/1978  U.S.S.R. .

*Primary Examiner*—William M. Shoop, Jr.
*Assistant Examiner*—Sharon D. Logan
*Attorney, Agent, or Firm*—Barnes & Thornburg

[57] ABSTRACT

A digital to analog signal converter having a resistor ladder and switching network of the R-2R type is provided with the 2R resistor legs divided into two parallel 4R resistors, the most significant bit stage replaced with a switchable terminating 4R resistor stage, and logic means provided for each remaining bit stage responsive to its own bit stage input signal as well as the MSB stage signal such that, at the mid scale, the added 4R terminating resistor is switchable in and there is no switching at the other 4R resistor legs. By reducing the switching noise at the lowest input signal level, the system signal to noise ratio is substantially increased. To further reduce switching noise, additional bit stages may be replaced by terminating resistors and the 2R resistor legs appropriately modified.

17 Claims, 4 Drawing Figures

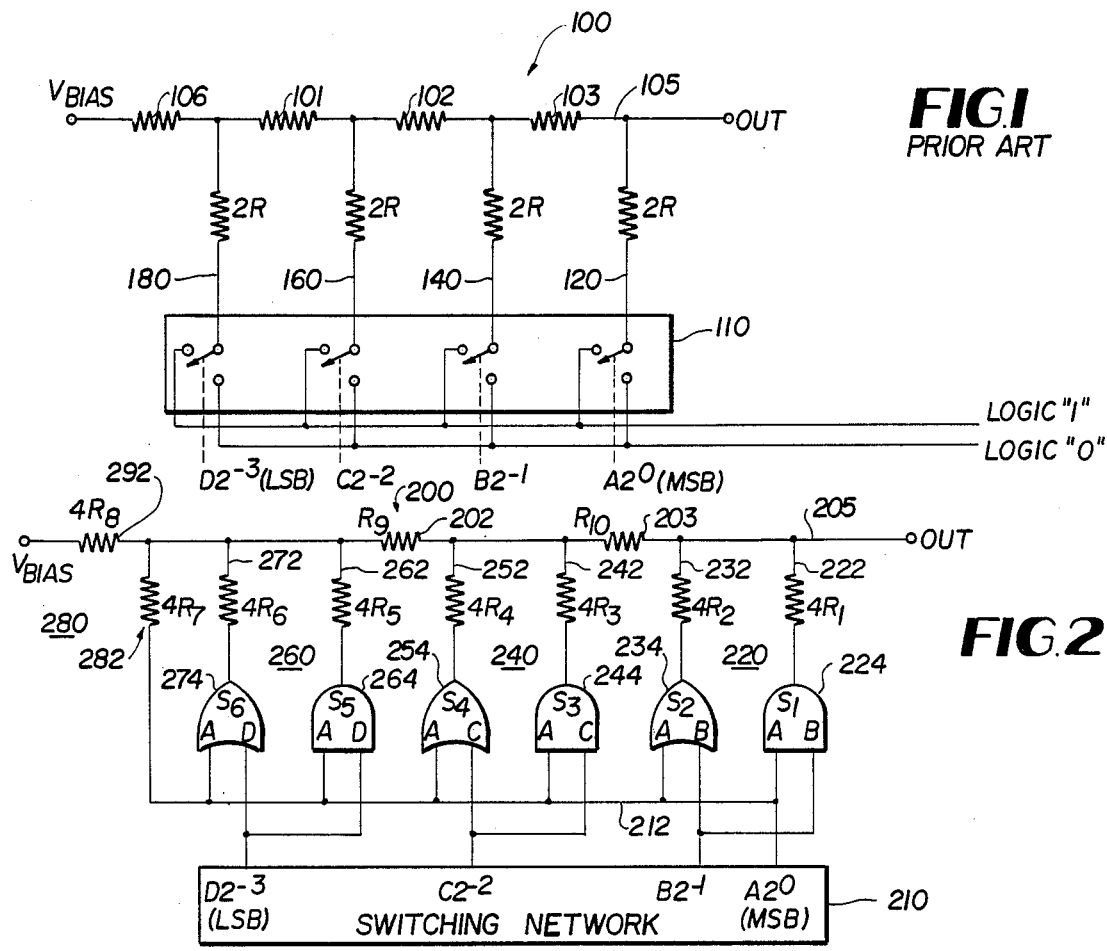
FIG.1 PRIOR ART
FIG.2
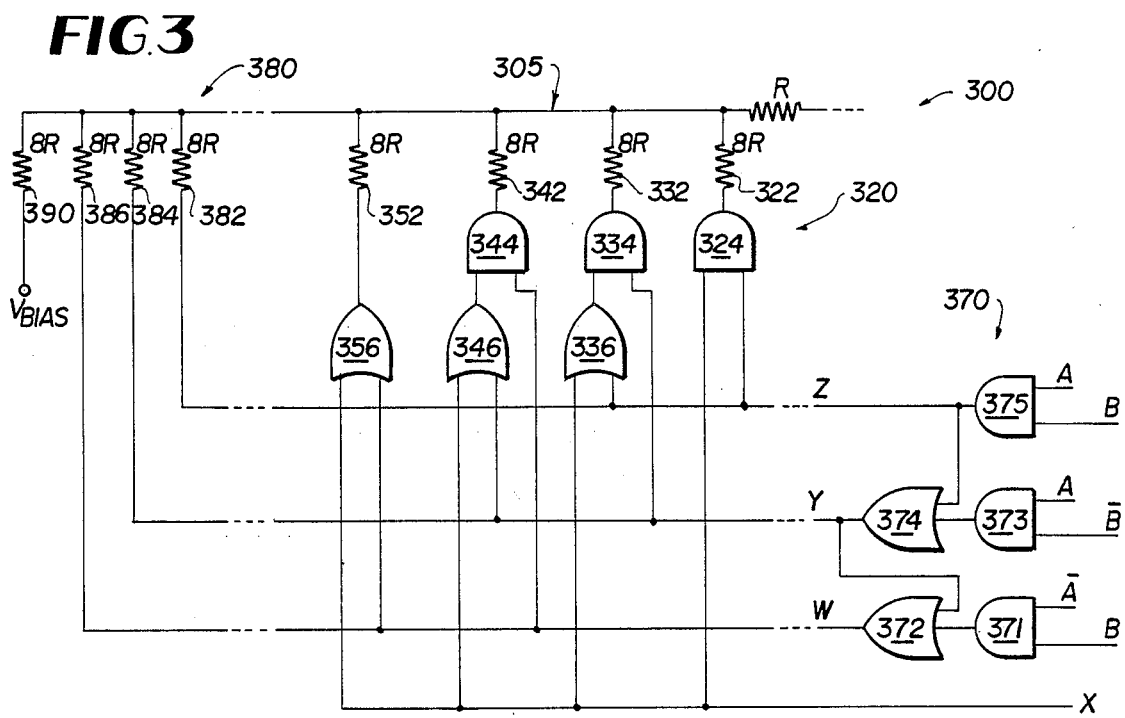
FIG.3

BINARILY WEIGHTED D TO A CONVERTER LADDER WITH INHERENTLY REDUCED LADDER SWITCHING NOISE

BACKGROUND OF THE INVENTION

The present invention relates generally to digital to analog converters and more particularly to digital to analog converters having a resistor ladder and switching network of the R-2R ratio type.

An inherent problem with conventional digital to analog (D/A) converters employing R-2R ladder networks for offset binary operation with zero mean signals is that the ideal or small signal output level about mid scale is at the major switching point. Since this major switching point generates the maximum switching noise and error, the signal-to-noise ratio is reduced at precisely the point where the signal is at its minimum. To illustrate this problem, and to provide a standard for comparison with the present invention, a conventional D/A converter 100 having a four bit signal resistor ladder is shown in FIG. 1. Although only four bit signals are employed in this example, any length of ladder could be used with no loss of generality.

In FIG. 1, converter 100 includes switching network means 110 responsive to a binary code of digital signals representative of electrical conditions or characteristics, such as voltage or current. In response to this binary code, switching means 110 completes electrical paths to resistor stages 120, 140, 160, and 180 such that bit signals A, B, C, and D, corresponding to each of these resistor stages respectivey, may pass to line 105, and, through series resistors 101, 102, and 103, to a common output. The resistor ladder is terminated with series terminating resistor 106, which is returned to some fixed signal level, $V_{bias}$. The sum of these electrical signals at the common output is an analog representation of the digital signals.

The coding action of the resistor ladder and switching network for converter 100, in terms of logical "1s" and "0s" input to converter 100 by switching means 110, is shown below in Table 1 on a step by step basis from lowest to highest output.

Any standard text will explain the operation of this resistor ladder converter in detail. The important points are that the ladder is built with resistors in the ratio of R-2R and that the bit signals driving the ladder all change value as the ladder output goes through mid scale. A zero mean signal, such as that commonly generated by voice or video signals, will be centered at the mid scale, and as the variance of the signal becomes smaller, a progressively larger percentage of the total noise generated will be that contributed by the mid scale or major switching point errors.

In the limit, where the signal is so small that it transverses only the mid scale switching point, the signal-to-noise ratio will be the root means square value of the signal, divided by the root means sum of the inherent quantization error and the ladder and switching error. Since all resistor ladder stages change state at this point, any errors due to either ladder resistor or ladder switches will be maximized at this switching point. At this error maximum the converter may lose monotonicity. A significant portion of the noise added to a signal generated by such a digital to analog converter will result from the sum of all the errors generated by switching. Anything which be done to reduce this source of error will directly improve the signal-to-noise ratio.

TABLE 1

| Bit Signal: | | | | Output | Number of |
| A | B | C | D | Level: | Switches: |
| --- | --- | --- | --- | --- | --- |
| 0 | 0 | 0 | 0 | 1/16 | 0 |
| 0 | 0 | 0 | 1 | 1/8 | 1 |
| 0 | 0 | 1 | 0 | 3/16 | 2 |
| 0 | 0 | 1 | 1 | 1/4 | 1 |
| 0 | 1 | 0 | 0 | 5/16 | 3 |
| 0 | 1 | 0 | 1 | 3/8 | 1 |
| 0 | 1 | 1 | 0 | 7/16 | 2 |
| 0 | 1 | 1 | 1 | 1/2 | 1 |
| Mid Scale: | | | | | |
| 1 | 0 | 0 | 0 | 9/16 | 4 |
| 1 | 0 | 0 | 1 | 5/8 | 1 |
| 1 | 0 | 1 | 0 | 11/16 | 2 |
| 1 | 0 | 1 | 1 | 3/4 | 1 |
| 1 | 1 | 0 | 0 | 13/16 | 3 |
| 1 | 1 | 0 | 1 | 7/8 | 1 |
| 1 | 1 | 1 | 0 | 15/16 | 2 |
| 1 | 1 | 1 | 1 | 1 | 1 |

SUMMARY OF THE INVENTION

An object of the present invention is the provision of an improved digital to analog converter for zero-mean electrical signals.

Another object is to provide a binarily-weighted digital to analog converter having logic means associated with the switching of a resistor ladder network which provides a minimum switching noise at mid scale.

A further object of the invention is the provision of a binarily-weighted digital to analog signal converter having a maximum signal-to-noise ratio for input signals having a zero mean.

Still another object of the present invention is to provide a digital-to-analog inverter whose mid scale switching is inherently monotonic.

Yet still another object is to provide a digital to analog signal converter having improved accuracy from noise reduction by elimination of the major switching at mid scale and a decrease in the required resistor accuracy provided by reduction in the resistor ladder network length.

These and other objects of the present invention are attained in a digital to analog signal converter having a resistor ladder and switching network of the R-2R type by dividing the 2R resistor legs into two parallel 4R resistors, by eliminating the most significant bit stage and replacing it with a switchable terminating 4R resistor stage in parallel with the series terminating resistor, also having 4R value, and by providing logic means for each remaining bit stage responsive to its own bit stage input signal as well as the MSB stage signal such that, at the mid scale, the added 4R terminating resistor is switched and there is no switching at the other 4R resistor legs. By reducing the switching noise at the lowest input signal level, the system signal-to-noise ratio is substantially increased.

To further reduce switching noise, additional bit stages may be replaced by switchable terminating resistors and the 2R legs appropriately modified. Where M equals the number of bit stages eliminated, the number of added parallel, switchable terminating resistors is $2^M - 1$, each such resistor and the series or nonswitchable terminating resistor having a value of $2^{M+1}R$. The 2R resistor legs of each remaining bit stage are replaced by 2M parallel resistors, each also having $2^{M+1}R$ value, and the logic for each resistor leg is responsive to the bit stage input signals for that stage as well as the bit signals for each of the deleted stages.

Other objects, advantages, and novel features of the present invention will become apparent from the following detailed description of the invention when considered in conjunction with the accompanying drawings.

BRIEF DESCRIPTION OF THE DRAWINGS

FIG. 1 is a schematic diagram of a conventional four bit digital to analog converter of the R-2R resistor ladder type.

FIG. 2 shows a schematic diagram of a four bit D/A converter of the R-2R resistor ladder type with 2R resistor leg and terminating resistor modification and MSB stage elimnination according to the present invention.

FIG. 3 shows a schematic diagram for the Xth resistor ladder stage of a D/A converter with resistor leg modification and two bit stages replaced according to a further embodiment of the present invention.

DESCRIPTION OF THE PREFERRED EMBODIMENTS

Figure 4:
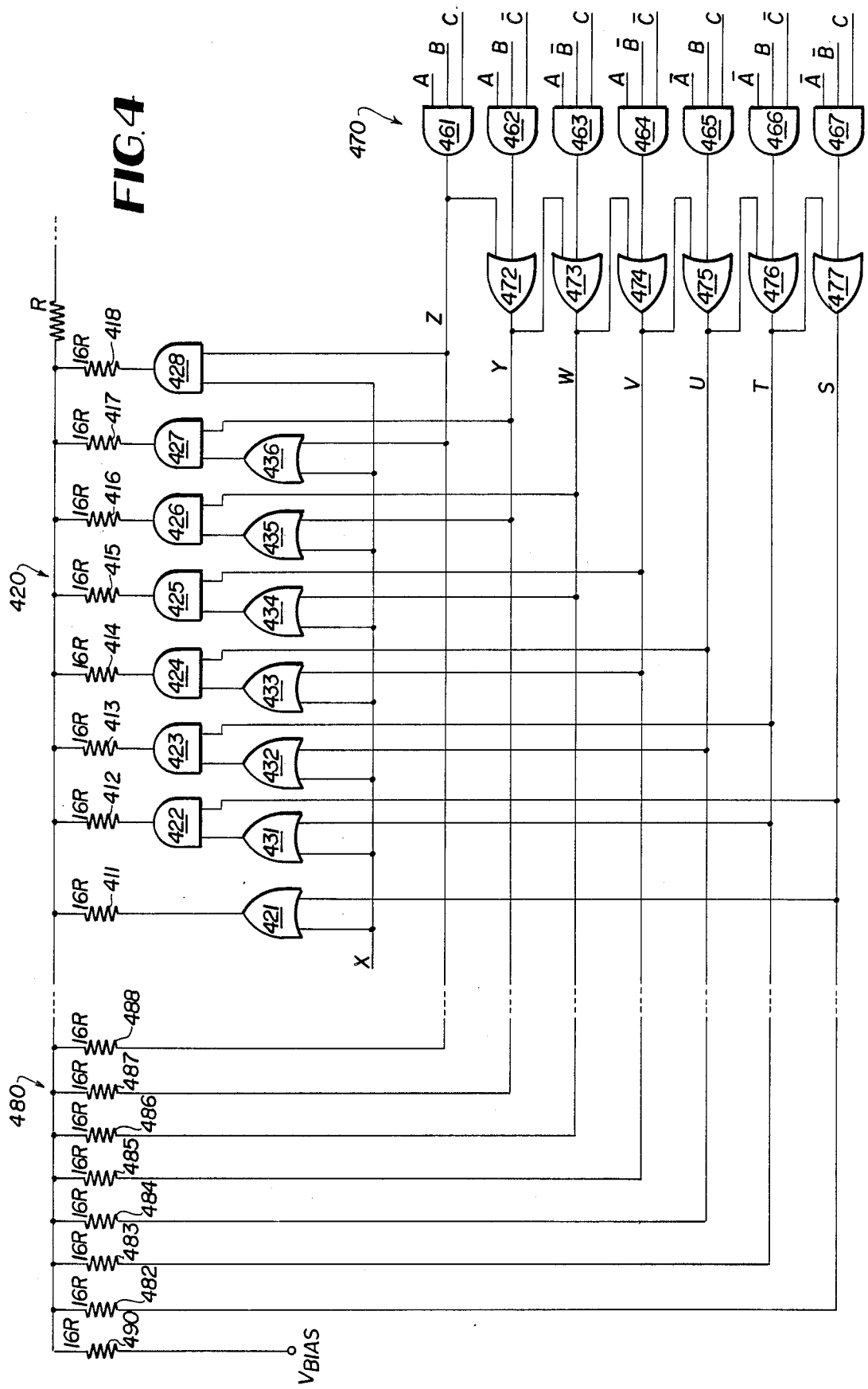
FIG. 4 shows a schematic diagram for the Xth resistor ladder stage of a D/A converter with three bit stages replaced.

FIG. 2, which illustrates a schematic diagram of a preferred embodiment of the present invention, shows a four bit version of a digital to analog (D/A) signal converter of the R-2R type. As with the conventional D/A converter shown in FIG. 1, D/A converter 200 produces an analog representation of the binary code forming the bit stage signals. It should be noted that, although the specific D/A signal converter described herein is composed of four stages, it is merely chosen as an illustration, and that the present invention also applies to a D/A signal converter of any number of stages.

The present invention divides the resistor stages of the resistor ladder network into a plurality of parallel resistor elements. Logic means switch the input signal through an increasing number of these parallel resistor elements in response to bit stage signals formed by an increasing binary code number. The terminating resistor stage, in combination with these bit stage logic means, permits a minimum of resistor switching at major switching points of D/A converter 100 since one or more of the most significant bit stages of the resistor ladder may be removed and the bit signal for those deleted stages passed only through a switchable terminating resistor network stage without disrupting the sequential D/A "count" in response to binary code changes. The same analog output is produced by summing several "turned on" resistor stage outputs of a D/A converter of the present invention as would be produced by a single "turned on" resistor stage output of D/A converter 100 in response to the same binary code input. As will be discussed below in detail, the advantage of using multiple "turned on" resistor stages at, for example, mid scale is that transitions through mid scale can be made to result in a minimum of switching noise.

D/A converter 200 has three resistor stages 220, 240 and 260, each of 2R total value, with series resistors 202 and 203, of R value, therebetween along transmission line 205. Terminating resistor stage 280 is composed of switchable resistor 282 in parallel with non-switchable resistor 292, connected to bias voltage $V_{bias}$, each such terminating resistor being of 4R value and their combined output being in parallel with the output of resistor stage 260. In comparison with D/A converter 100, each 2R resistor leg in resistor stages, 106 140, 160, and 180 has been replaced by two 4R resistor legs 282 and 292, 222 and 232, 242 and 252, and 262 and 272, respectively, such that parallel combinations of these 4R legs gives the required 2R resistance. Note that converter 200 is one resistor stage shorter than if converter 100 simply had every 2R stage replaced with two parallel 4R resistors and includes switchable resistor 282 with non-switchable resistor 292.

Converter 200 includes switching network means 210 responsive to a binary code of digital signals representing electrical conditions or characteristics. As switching means 210 functions similarly to conventional switching means 110, it will not be discussed in detail herein.

Binary codes of input signal data comprising, for example, digital marks and spaces, are referred to herein as bit signals A, B, C, and D and are applied to these logic gating means as they would be applied to the corresponding resistor stages in FIG. 1. Bit A is, by the nature of the R-2R resistor ladder structure, the most significant bit (MSB); bit B is the second most significant bit (MSB−1); and so on for as many bits as may be employed until the final bit, D, in this 4 bit model, representing the least significant bit (LSB). In the example of converter 200, four controlling bit signals are provided by switching means 210 to resistor stages 220, 240, and 260 and terminating resistor stage 280.

Logic means are associated with each resistor leg of converter 200, except those in terminating resistor stage 280, and are connected between switching means 210 and each such resistor leg so as to receive as inputs the bit signals from switching means 210. As shown in FIG. 2, 4R resistor legs 222, 232, 242, 252, 262, and 272 are connected to the output of and controlled by, two-input logic gate means 224, 234, 244, 254, 264 and 274, respectively. These logic gate means may, for example, be alternating AND and OR gates.

Logic gate means 224 is, for example, an AND gate and has bit signals A and B as inputs. Logic gate means 234 is, for example, an OR gate and also has bit signals A and B as inputs. Likewise, AND gates 244 and 264 have bit signals A and C and A and D as inputs, respectively, and OR gates 254 and 274 also have bit signals A and C and A and D as inputs, respectively. Terminating resistor stage 280, having a single, switchable 4R resistor element 282 therein, is connected directly to the source of bit signal A in switching means 210 through common transmission line 212. Thus, one input to each logic gating means is that bit signal of data which would have driven the corresponding 2R resistor stage in converter 100. The other bit signal input, which would have driven resistor stage 120 and which represents the MSB, is common to each logic gating means. Step by step coding action of the resistor ladder and switching of the logic gates is shown in Table 2 starting with the lowest output and increasing. Table 2 may be compared to Table 1 to illustrate advantages of the present invention over the conventional D/A converter.

As shown, the lowest output results from an all "0" bit signal input and is 1/16 the full scale output, provided by nonswitchable terminating resistor 292 tied to full scale of $V_{bias}$. As the binary code count increases to "0001" from "0000", OR gate 274 "turns on" resistor leg 272, i.e., connects it to transmission line 205 so that electrical signals may pass therethrough, upon receiving a "1" input signal from LSB D. Next, OR gate 254 turns on resistor leg 252 and resistor leg 272 turns off as bit signal C becomes "1" and bit signal D returns to "0" at binary code count "0010". At this second bit signal level there are, thus, two switched resistors or "switching points". Next, resistor leg 272 is turned on concurrently with resistor leg 252 as both C and D are "1" at binary code count "0011". Since only one resistor leg changed its state, only one switching point occurs here. Similarly, at a binary code count of "0100", OR gate 234 turns on resistor leg 232 and resistor legs 252 and 272 are turned off by OR gates 254 and 274, respectively. At "0101" resistor legs 232 and 272 are turned on and at "0110" resistor legs 232 and 252 are turned on while all other resistor legs remain turned off.

As the binary code count increases, the output of converter 200 increases. At mid scale, where the output is one half full scale and the binary code count is "0111", each OR gate has an input signal and has, thus, turned on a single 4R resistor leg in each of resistor stages 220, 240 and 260 connected to line 205 to output. Since the AND gates additionally require bit signal A to be "1", none of the resistor legs tied to AND gates are turned on. As the binary code count passes through mid scale to "1000", bit signal A becomes "1" and all the other bit signals become "0". However, because each OR gate is also tied to bit signal A, none of the resistor legs previously turned on are now turned off, and signal output from these resistor stages remains the same. Only resistor 282 in terminating resistor stage 280 is switched on at mid scale, and that is equivalent to the LSB signal response. Therefore, switching noise through resistor stages 220, 240, and 260 is at a minimum and constant over that analog signal range corresponding to the LSB.

As the data bit count further increases, the output of the OR gates remain at "1" and maintain their respective 4R resistors in the circuit and the AND gates are enabled and increase converter 200 output. At full count, or full scale, all bit signal inputs are "1" and all the 4R resistors are in the circuit. As can be seen from Table 2, the major switching points fall at one-quarter and three-quarter scale while a minimum switching point falls at mid scale.

Thus, while the present invention requires a more complex structure than is conventionally employed in D/A converters, the overall conversion system has gains in accuracy. These gains result from the reduction in switchng noise by eliminating the major switching point at mid scale, where the input signal is typically weakest, and from a decrease in the required resistor accuracy afforded by a reduction in the number of resistor stages necessary.

While in the example of FIG. 2 the common bit signal input to the logic gating means of each resistor leg was the MSB, the present invention specifically contemplates use of other data bit signals as the common signal depending upon the particular switching and output characteristics desired with particular arrangements of logic gating means in the D/A converter.

TABLE 2

| Bit Signals: | | | | Output of Logic Gate: | | | | | | Terminating Resistor: | Output: | Number of Switching Points: |
|---|---|---|---|---|---|---|---|---|---|---|---|---|
| A | B | C | D | 224 | 234 | 244 | 254 | 264 | 274 | 282 | | |
| 0 | 0 | 0 | 0 | 0 | 0 | 0 | 0 | 0 | 0 | 0 | 1/16 | 1 |
| 0 | 0 | 0 | 1 | 0 | 0 | 0 | 0 | 0 | 1 | 0 | 1/8 | 2 |
| 0 | 0 | 1 | 0 | 0 | 0 | 0 | 1 | 0 | 0 | 0 | 3/16 | 1 |
| 0 | 0 | 1 | 1 | 0 | 0 | 0 | 1 | 0 | 1 | 0 | 1/4 | 3 |
| 0 | 1 | 0 | 0 | 0 | 1 | 0 | 0 | 0 | 0 | 0 | 5/16 | 1 |
| 0 | 1 | 0 | 1 | 0 | 1 | 0 | 0 | 0 | 1 | 0 | 3/8 | 2 |
| 0 | 1 | 1 | 0 | 0 | 1 | 0 | 1 | 0 | 0 | 0 | 7/16 | 1 |
| 0 | 1 | 1 | 1 | 0 | 1 | 0 | 1 | 0 | 1 | 0 | 1/2 | 1 |
| Mid Scale: | | | | | | | | | | | | |
| 1 | 0 | 0 | 0 | 0 | 1 | 0 | 1 | 0 | 1 | 1 | 9/16 | 1 |
| 1 | 0 | 0 | 1 | 0 | 1 | 0 | 1 | 1 | 1 | 1 | 5/8 | 1 |
| 1 | 0 | 1 | 1 | 0 | 1 | 1 | 1 | 0 | 1 | 1 | 11/16 | 2 |
| 1 | 0 | 1 | 1 | 0 | 1 | 1 | 1 | 1 | 1 | 1 | 3/4 | 1 |
| 1 | 1 | 0 | 0 | 1 | 1 | 0 | 1 | 0 | 1 | 1 | 13/16 | 3 |
| 1 | 1 | 0 | 1 | 1 | 1 | 0 | 1 | 1 | 1 | 1 | 7/8 | 1 |
| 1 | 1 | 1 | 0 | 1 | 1 | 1 | 1 | 0 | 1 | 1 | 15/16 | 2 |
| 1 | 1 | 1 | 1 | 1 | 1 | 1 | 1 | 1 | 1 | 1 | 1.0 | 1 |

As a further, alternative means of understanding the present invention, consider the resistor ladder output range divided into equal bands which may be equated with the resistor legs therein. Where M equals the number of bit stages deleted from the conventional R-2R type converter form, $2^M - 1$ is the number of parallel switched resistor legs which must be present in the terminating resistor stage. The 2R resistor stages include $2^M$ parallel resistor legs in each stage, and each resistor leg has a value of $2^{M+1}$ (including switchable terminating resistor legs and the non-switchable terminating resistor).

Thus, each parallel resistor leg in each resistor stage corresponds to one band. With regard to the output level of a particular band, all of the resistors corresponding to bands lower in value are programmed by logic means to "1". The resistors corresponding to bands greater in value are left at "0". The resistor corresponding with that particular band is switchable according to its binary weighting and with the desired output value within the band. The number of switchable resistor legs in the terminating resistor stage is a function of the number of transitions eliminated by deleting a particular resistor stage. For example, if MSB A stage is removed, only a single transition is eliminated and, thus, a single switchable resistor leg is in the terminating resistor stage. If MSB−1 B stage is removed, three transitions are eliminated and three switchable resistor legs are in the terminating resistor stage. The proof of this may be derived by many standard techniques, including truth tables.

Each resistor stage is connected to its neighbor by a series resistor R, and each resistor stage consists of $2^M$ parallel resistors of $2^{M+1}$ value. The ladder output is inherently monotonic between bands, and the required ladder accuracy is that necessary to code within the band. In other words, the coding of a P- bit word is not that required for P stages, but, rather, that required for P-M stages.

FIG. 3 shows a schematic diagram of the Xth resistor stage 320 for D/A converter 300 having two resistor stages, corresponding to bit signals A and B, removed from the ladder network. Each 2R resistor stage of converter 300 has four 8R resistor legs 322, 332, 342, and 352 in parallel such that their combination produces the required 2R resistance. The 8R resistor legs are connected to and controlled by logic gating means 324, 334, 344, 336, 346, and 356 having inputs from the Xth bit signal and a separate, common logic stage 370, whose outputs are derived from the A and B bit signals. As mentioned above, A and B correspond in these figures to the MSB and the MSB−1.

Three switchable 8R resistor legs 382, 384, and 386 have been included in terminating resistor stage 380. Non-switchable terminating resistor 390 also has 8R value. Common logic means 370 is connected to each of resistor legs 382, 384, and 386 and has inputs from bit signals A and B to logic means 371, 372, 373, 374, and 375 so as to increasingly switch on these resistors, through W, Y, and Z signals, as the A and B bit count increases. AND gate 375 receives A and B signals to produce Z signals. AND gate 373 receives A and inverse B signals and outputs signals to OR gate 374, which also receives Z signals and which produces Y signals. AND gate 371 receives inverse A and B signals and outputs signals to OR gate 372 which receives Y signals as well and which produces W signals. W, Y, and Z signals are also inputs to AND gate 344 and OR gate 356, AND gate 334 and OR gate 346, and AND gate 324 and OR gate 336, respectively. AND gate 324 and OR gates 336, 346, and 356 also receive inputs from the Xth bit signal. AND gates 334 and 344 also receive inputs from the output signals of OR gates 336 and 346, respectively. The output signals from AND gates 324, 334 and 344 and OR gate 356 are applied to resistors 322, 332, 342, and 352, respectively. Similarly, the outputs of common logic means 370 may be connected as inputs to every other resistor stage in converter 300.

Step by step coding action and logic gate switching of converter 300 is shown in Table 3. Briefly, the logic switching of common logic stage 370 is as follows. At a binary code count of "000", none of the 8R resistor legs is turned on to transmission line 305. All logic gates in common logic stage 370 are zero, as A and B are both "0". When the binary code count is "001", i.e., A and B are "0" and X is "1", OR gate 356, responsive to inputs from X or W, is enabled and resistor leg 352 is turned on. AND gates 371, 373, and 375 responsive to A and B, A and B, and A and B, respectively are not enabled so W, Y, and Z are "0" and resistors 382, 384, and 386 are turned off. When the count is "010", A and X are "0" and B is "1" AND gate 371 and OR gate 372, responsive to gates 371 or 374, are enabled, and thus, W is "1". OR gate 356 remains enabled and resistor leg 352 stays turned on, but resistor 386 is now also turned on. When the count is "011", A is "0", and B and X are "1"; resistors 352 and 386 stay turned on, and OR gate 346, responsive to X or Y, is enabled and inputs a signal to AND gate 344, responsive to W and gate 346, which is then also enabled and turns on resistor leg 342.

TABLE 3

| Bit Signals | | | Output of Logic Gate | | | | | | | | | | | Number of Resistor Switching Points | |
|---|---|---|---|---|---|---|---|---|---|---|---|---|---|---|---|
| | | | | | | | | | | | | | | Xth Stage | Terminating Stage |
| A | B | X | 371 | 372 | 373 | 374 | 375 | 356 | 346 | 336 | 344 | 334 | 324 | 305 | 380 |
| 0 | 0 | 0 | 0 | 0 | 0 | 0 | 0 | 0 | 0 | 0 | 0 | 0 | 0 | 0 | 0 |
| 0 | 0 | 1 | 0 | 0 | 0 | 0 | 0 | 1 | 1 | 1 | 0 | 0 | 0 | 1 | 0 |
| 0 | 1 | 0 | 1 | 1 | 0 | 0 | 0 | 1 | 0 | 0 | 0 | 0 | 0 | 0 | 1 |
| 0 | 1 | 1 | 1 | 1 | 0 | 0 | 0 | 1 | 1 | 1 | 1 | 0 | 0 | 1 | 0 |
| 1 | 0 | 0 | 1 | 1 | 1 | 1 | 0 | 1 | 1 | 0 | 1 | 0 | 0 | 0 | 1 |
| 1 | 0 | 1 | 1 | 1 | 1 | 1 | 0 | 1 | 1 | 1 | 1 | 1 | 0 | 1 | 0 |
| 1 | 1 | 0 | 1 | 1 | 1 | 1 | 1 | 1 | 1 | 1 | 1 | 1 | 1 | 0 | 1 |
| 1 | 1 | 1 | 1 | 1 | 1 | 1 | 1 | 1 | 1 | 1 | 1 | 1 | 1 | 1 | 0 |

When the count is "100" (passing through mid scale) A is "1" and B and X are "0"; AND gate 373, OR gate 374, responsive to gates 373 or 375, and OR gate 372 are enabled, and thus, W and Y are "1". Resistor legs 342, 352, and 385 stay turned on, and resistor 384 is now turned on. Since no other resistors in stage 320 are turned on or off at this point, switching noise is at a minimum.

As the count continues to "101", OR gates 356 and 346 and AND gate 344 remain enabled, and resistor legs 342 and 342 remain on, and OR gate 336, which responds to Z or X, is now enabled. AND gate 334, which responds to OR gate 336 and Y, is also now enabled, and turns on resistor leg 332 in the Xth stage. Since neither A nor B changed state, common logic means 370 did not change state, and all terminating resistors remain in their previous state. No change occurs in stage 320 as the count becomes "110", but AND gate 375 in common logic means 370 is enabled by both A and B being logical "1" and causes Z to become "1" which also holds Y and W both at "1" through OR gates 374 and 372. Thus, terminating resistors 386 and 384 remain on, and terminating resistor 382 is now turned on, producing one switching point. At full scale the count is "111" and all bit signals are "1". Resistor legs 332, 342, and 352 remain turned on since gates 334, 344, and 356 remain enabled. In addition, AND gate 324, having inputs from bit signal X and signal Z, is enabled and turns on final resistor leg 322.

As can be seen from the above description, as the binary code count increases, resistor stage 320 increasingly turns on more resistor legs to line 305 without turning any resistor legs off. Thus, switching noise caused by turning off or on resistors from that stage is significantly reduced, as compared to conventional D/A converter 100 wherein some resistor legs are turned off when other resistor legs are turned on. Terminating resistor stage 380 also only turns on resistors without turning any off. Furthermore, terminating stage 380 turns on resistors only when stage 320 does not change state. Thus, switching noise does not build up at any particular count. It should be noted that while switching does occur in logic gating means 346 and 356 while the turned on status of the resistor legs remains unchanged, these do not result in significant increased system noise since the settling time of resistors 332, 332, 343, and 352 is much longer than the settling time of the logic gates.

Similarly, FIG. 4 shows a schematic diagram of D/A converter 400 with the Xth resistor stage 420 for a resistor ladder having three bit stages replaced by a terminating resistor stage. Each 2R resistor stage has eight 16R resistor legs in parallel and the logic means for each resistor leg is responsive to the Xth input bit signal for that stage. Also shown in FIG. 4 is terminating stage 480, having eight 16R resistor legs 490 and 482–488, and common logic means 470. Common logic means 470 may be connected, as described below, to every resistor stage in converter 400 and has input signals from bit signals A, B, and C, corresponding with the deleted bit stages, received by logic means 461, 462, 463, 464, 465, 466, and 467. AND gate 461 receives A, B, and C signals and outputs signal Z. AND gate 462 receives A, B, and inverse C signals and outputs a signal to OR gate 473. AND gate 464 receives A, inverse B, and inverse C signals and outputs a signal to OR gate 474. AND gate 465 receives inverse A, B, and C signals and outputs a signal to OR gate 476. AND gate 467 receives inverse A, inverse B, and C signals and outputs a signal to OR gate 477.

OR gate 472 also receives Z signals and outputs signal Y, OR gate 473 also receives Y signals and outputs signal W. OR gate 474 also receives V signals and outputs signal U. OR gate 476 also receives U signals and outputs signal T. OR gate 477 also receives T signals and outputs signal S.

Logic means for resistor stage 420 includes logic gate means 421, 422, 423, 424, 425, 426, 427, and 428 with outputs to resistor legs 411, 412, 413, 414, 415, 416, 417, and 418, respectively, and logic gate means 431, 432, 433, 434, 435, and 436 with outputs to logic gate means 422, 423, 424, 425, 426, 427, and 428, respectively. Each of OR gates 421, 431–436 has inputs from both X and S, T, U, V, W, Y, or Z, respectively. Each of AND gates 422–428 also has inputs from S, T, U, V, W, Y, or Z, respectively.

Likewise, switchable resistor legs 482–488 of terminating resistor stage 480 each receive signals from S, T, U, V, W, Y, or Z, respectively. Although connecting lines for output signals of common logic means 470 are not specifically shown in FIG. 4, such connections are conventional and readily apparent to those skilled in the art. Deletion here is only for simplicity of the Figure.

Briefly, as the format for this analysis has been explained above in detail, common logic means 470 decodes the successive logic states of the three most significant bits, A, B, and C, and outputs signals S, T, U, V, W, Y and Z. Signals S, T, U, V, W, Y, and Z change stage only when A, B, or C change state, and do not respond to changes in the state of X. When a particular output signal is "1" in response to a particular count of bits A, B, and C, then all those output signals responding to lower counts of A, B, and C are also "1". Thus, if V is "1", U, T, and S will be "1".

TABLE 4

| Bit Signal | | | | Common Logic Means 470 Output | | | | | | | Terminating Resistor States | | | | | | |
|---|---|---|---|---|---|---|---|---|---|---|---|---|---|---|---|---|---|
| A | B | C | X | S | T | U | V | W | Y | Z | 482 | 483 | 484 | 485 | 486 | 487 | 488 |
| 0 | 0 | 0 | 1 | 0 | 0 | 0 | 0 | 0 | 0 | 0 | 0 | 0 | 0 | 0 | 0 | 0 | 0 |
| 0 | 0 | 1 | 0 | 1 | 0 | 0 | 0 | 0 | 0 | 0 | 1 | 0 | 0 | 0 | 0 | 0 | 0 |
| 0 | 0 | 1 | 1 | 1 | 0 | 0 | 0 | 0 | 0 | 0 | 1 | 0 | 0 | 0 | 0 | 0 | 0 |
| 0 | 1 | 0 | 0 | 1 | 1 | 0 | 0 | 0 | 0 | 0 | 1 | 1 | 0 | 0 | 0 | 0 | 0 |
| 0 | 1 | 0 | 1 | 1 | 1 | 0 | 0 | 0 | 0 | 0 | 1 | 1 | 0 | 0 | 0 | 0 | 0 |
| 0 | 1 | 1 | 0 | 1 | 1 | 1 | 0 | 0 | 0 | 0 | 1 | 1 | 1 | 0 | 0 | 0 | 0 |
| 0 | 1 | 1 | 1 | 1 | 1 | 1 | 0 | 0 | 0 | 0 | 1 | 1 | 1 | 0 | 0 | 0 | 0 |
| 1 | 0 | 0 | 0 | 1 | 1 | 1 | 1 | 0 | 0 | 0 | 1 | 1 | 1 | 1 | 0 | 0 | 0 |
| 1 | 0 | 0 | 1 | 1 | 1 | 1 | 1 | 0 | 0 | 0 | 1 | 1 | 1 | 1 | 0 | 0 | 0 |
| 1 | 0 | 1 | 0 | 1 | 1 | 1 | 1 | 1 | 0 | 0 | 1 | 1 | 1 | 1 | 1 | 0 | 0 |
| 1 | 0 | 1 | 1 | 1 | 1 | 1 | 1 | 1 | 0 | 0 | 1 | 1 | 1 | 1 | 1 | 0 | 0 |
| 1 | 1 | 0 | 0 | 1 | 1 | 1 | 1 | 1 | 1 | 0 | 1 | 1 | 1 | 1 | 1 | 1 | 0 |
| 1 | 1 | 0 | 1 | 1 | 1 | 1 | 1 | 1 | 1 | 0 | 1 | 1 | 1 | 1 | 1 | 1 | 0 |
| 1 | 1 | 1 | 0 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 1 | 0 |

| Bit Signal | | | | $X^{th}$ Stage Resistor States | | | | | | | | Number of Resistor Switching Points |
|---|---|---|---|---|---|---|---|---|---|---|---|---|
| A | B | C | X | 411 | 412 | 413 | 414 | 415 | 416 | 417 | 418 | |
| 0 | 0 | 0 | 1 | 1 | 0 | 0 | 0 | 0 | 0 | 0 | 0 | 1 |
| 0 | 0 | 1 | 0 | 1 | 0 | 0 | 0 | 0 | 0 | 0 | 0 | 1 |
| 0 | 0 | 1 | 1 | 1 | 1 | 0 | 0 | 0 | 0 | 0 | 0 | 1 |
| 0 | 1 | 0 | 0 | 1 | 1 | 0 | 0 | 0 | 0 | 0 | 0 | 1 |
| 0 | 1 | 0 | 1 | 1 | 1 | 1 | 0 | 0 | 0 | 0 | 0 | 1 |
| 0 | 1 | 1 | 0 | 1 | 1 | 1 | 0 | 0 | 0 | 0 | 0 | 1 |
| 0 | 1 | 1 | 1 | 1 | 1 | 1 | 1 | 0 | 0 | 0 | 0 | 1 |
| 1 | 0 | 0 | 0 | 1 | 1 | 1 | 1 | 0 | 0 | 0 | 0 | 1 |
| 1 | 0 | 0 | 1 | 1 | 1 | 1 | 1 | 1 | 0 | 0 | 0 | 1 |
| 1 | 0 | 1 | 0 | 1 | 1 | 1 | 1 | 1 | 0 | 0 | 0 | 1 |
| 1 | 0 | 1 | 1 | 1 | 1 | 1 | 1 | 1 | 1 | 0 | 0 | 1 |
| 1 | 1 | 0 | 0 | 1 | 1 | 1 | 1 | 1 | 1 | 0 | 0 | 1 |
| 1 | 1 | 0 | 1 | 1 | 1 | 1 | 1 | 1 | 1 | 1 | 0 | 1 |
| 1 | 1 | 1 | 0 | 1 | 1 | 1 | 1 | 1 | 1 | 1 | 0 | 1 |
| 1 | 1 | 1 | 1 | 1 | 1 | 1 | 1 | 1 | 1 | 1 | 1 | |

At count "0001", only OR gate 421 is enabled by input bit X, and only resistor 411 is turned on. At count 0010, S is "1", enabling OR gate 421, and resistor 482 now turns on, resistor 411 remaining on. At the count of 0011, OR gate 421 is enabled, enabling AND gate 422, whoe inputs are S and gate 431. This turns on resistor leg 412. At the count of 0100, signal T is "1", which also holds S to be "1". S holds resistor leg 482, on and, through OR gate 421, resistor leg 411. Resistor leg 412 is held on by the combination of T through OR gate 431, and S through AND gate 422. T itself turns on resistor 483. At count 0101, there is no change in the state of common logic means 470, and thus no resistors in termination stage 480 change state. OR gates 432 is enabled by bit signal X, which in turn enables AND gate 423, responsive to T and gate 432. Gate 423 thus turns on resistor leg 413. A similar analysis for the rest of the count will be readily apparent to those skilled in the art.

It may thus be seen that, as the binary code represented by the state of the most significant bits, A, B, and C increases in value, terminating resistors are increasingly turned on, one at a time, while resistor legs in the Xth stage are held on, by the output of common logic means 470. It may also be seen that at each change of state or count of the most significant bits A, B, and C, representing an increase or decrease in the count of said bits A, B, and C, only one resistor in said terminating stage 480 changes state. It may also be seen that a change in the count of the most significant bits A, B and C does not result in a change in state in the resistors found in the Xth stage. Finally, it may further be seen that a change in bit signal X does not cause a change in the state of the resistors comprising terminating stage 480. Thus, again, as the converter switches through mid-scale, only one switching point occurs.

From the preceeding description of the preferred embodiment, it is evident that the objects of the invention are attained. Although the present invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A binarily-weighted digital to analog converter for electrical signals comprising:
   a switching means responsive to a binary code group of digital marks and spaces to generate N bit signals, where N is greater than one;
   a resistor ladder network having N-M resistor stages and a terminating resistor stage, where M is equal to or greater than one, each of said resistor stages having $2^M$ parallel resistor legs therein, and N-M of said bit signals each corresponding uniquely with specific resistor stages;
   logic means controlling each of said resistor stages so as to connect one or more current or voltage sources to a common output through said resistor stages where the sum of the current or voltage sources so connected is an analog representation of the data carried by said binary code group; and
   wherein each of said logic means are responsive to said bit signal corresponding uniquely with that resistor stage controlled by said logic means as well as the M bit signals not uniquely corresponding with a specific resistor stage.

2. The digital to analog converter according to claim 1 wherein said resistor ladder network is of the R-2R type and wherein said parallel resistor legs are of equal value within each resistor stage.

3. The digital to analog converter according to claim 1 including a second logic means responsive to a plurality of bit signals for providing input signals to a plurality of said logic means associated with said resistor stages.

4. The digital to analog converter according to claim 1 wherein said terminating resistor stage includes $2^M - 1$ parallel terminating resistor legs, and said resistor ladder network further includes a series terminating resistor tied to a bias current or voltage source.

5. A digital to analog converter comprising:
   a resistor ladder network having a plurality of resistor stages each of said stages having at least one resistor leg;
   a switching network means, responsive to a binary code of digital signals, to complete one or more electrical paths to said resistor stages, said binary code of digital signals having bit signals each corresponding to particular resistor stage and switchable by said switching network means into that resistor stage; and
   logic means associated with each of said resistor stages and having, as control input signals, the bit signal corresponding to that resistor stage from said switching network means and at least one other bit signal from said binary code of digital signals where the resistor stage for said other bit signal has been deleted from said resistor network, said logic means controlling the passage of electrical signals from said switching network means through said resistor stage to a common output where the sum of said electrical signals at said common output is an analog representation of said digital signals.

6. The digital to analog converter according to claim 5 wherein each of said resistor stages having said logic means associated therewith has a plurality of resistor legs arranged in parallel therein.

7. The digital to analog converter according to claim 6, wherein said resistor ladder network includes a terminating resistor leg connected to said switching network means.

8. The digital to analog converter according to claim 6, wherein said resistor ladder network is of the R-2R type and each of said parallel resistor legs within a single resistor stage is of equal value.

9. The digital to analog converter according to claim 8, wherein said resistor ladder network includes a terminating resistor stage connected between said switching network means and said common output for electrical signals and having as its input signals the bit signals corresponding to said deleted resistor stages.

10. In a digital to analog converter for electrical signals having a resistor ladder of the R-2R type with a series terminating resistor and a plurality of 2R type resistor stages, each such resistor stage having at least one resistor leg therein and being separated by series resistors; and a switching means, responsive to input signals from a binary code group to transmit bit signals to said resistor stages, each such bit signal corresponding to a particular resistor stage; the improvement comprising:
    replacing one or more resistor stages with a terminating resistor stage in parallel with the series terminating resistor and having at least one terminating resistor leg therein for each resistor stage replaced;

replacing the 2R resistor legs of said 2R type resistor stages with a plurality of parallel resistor legs whose combination provides 2R equivalent resistance in each 2R resistor leg; and logic means for said parallel resistor legs such that each resistor stage is responsive to the bit signal corresponding to that resistor stage as well as the bit signal for said resistor stages replaced with said terminating resistor stage.

11. The digital to analog converter according to claim 10, wherein the improvement further comprises deleting the most significant bit resistor stage, replacing each 2R resistor leg with two 4R resistor legs in parallel, providing a single, additional 4R resistor leg in said terminating resistor stage, in parallel with said series terminating resistor, also of 4R value, and wherein said logic means is such that, at mid scale of said binary code group signals, the 4R resistor leg of said terminating resistor is switchable into said resistor ladder circuit and there is no switching of any other 4R resistor leg.

12. The digital to analog converter according to claim 10, wherein the most significant bit and next most significant bit stages are replaced with three parallel 8R resistor legs in the terminating resistor stage in parallel with said series terminating resistor, also of 8R value, and said logic means is such that each resistor leg in each of said resistor stages responsive to input bit signals for that resistor stage and for each of the bit signals from said replaced resistor stages so as to complete electrical paths through their resistor stage.

13. The digital to analog converter according to claim 10, wherein the relationship between the number of resistor stages removed and the structure of the converter elements is that where M equals the number of said resistor stages removed and replaced by said terminating resistor stage, $2^M - 1$ is the number of parallel terminating resistor legs in said terminating resistor stage, each such terminating resistor leg and said series terminating resistor having a value of $2^{M+1}R$, and each of said 2R resistor legs is replaced by $2^M$ parallel resistors, each also of $2^{M+1}R$ value.

14. The digital to analog converter according to claim 10, wherein said logic means includes an equal number of AND and OR gate means, each responsive to two input signals and each controlling a single resistor leg, connected between said switching means and said resistor legs.

15. The digital to analog converter according to claim 10, wherein said logic means includes separate gate means connected to each of said resistor stages and a common gate means having outputs to each of said separate gate means when more than one resistor stage has been replaced by said terminating resistor stage, and wherein said separate gate means are each responsive to said bit signal corresponding to that stage and said output of the common gate means to complete electrical paths through their respective resistor legs, and wherein said common gate means is responsive to bit signals corresponding to said resistor stages replaced by said terminating resistor stage so as to produce an output signal to each of said separate gate means.

16. The digital to analog according to claim 15, wherein said terminating resistor stage includes a terminating logic gate means responsive to bit signals corresponding to said replaced resistor stages so as to control electrical connection of said terminating resistor legs to said converter circuit.

17. A method of converting digital electrical signals to an analog electrical representation of those signals in a converter having a resistor ladder network with a plurality of bit stages, including a terminating resistor stage, each of said bit stages having a plurality of resistor legs therein; switching means responsive to said digital signals so as to produce a plurality of bit signals, the number of said bit signals being greater than the number of said bit stages such that each bit stage has a single bit signal uniquely corresponding therewith and each bit stage receiving inputs signals commonly with the remaining bit signals; and logic means associated with said bit stages and receiving said bit signals as input signals to control completion, of an electrical path through each resistor leg in said resistor ladder network; the method comprising controlling said logic means such that for any and every sequential change in the count of said bit signal, only a single resistor leg has the electrical path therethrough completed or broken by said logic means.

* * * * *